United States Patent
Takahashi et al.

(10) Patent No.: US 12,197,747 B2
(45) Date of Patent: Jan. 14, 2025

(54) LOGIC SIMULATION DEVICE

(71) Applicant: SONY SEMICONDUCTOR SOLUTIONS CORPORATION, Kanagawa (JP)

(72) Inventors: Haruko Takahashi, Kanagawa (JP); Masami Kuroda, Kanagawa (JP); Midori Aizawa, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 12 days.

(21) Appl. No.: 18/041,026

(22) PCT Filed: Aug. 4, 2021

(86) PCT No.: PCT/JP2021/029021
§ 371 (c)(1),
(2) Date: Feb. 8, 2023

(87) PCT Pub. No.: WO2022/044749
PCT Pub. Date: Mar. 3, 2022

(65) Prior Publication Data
US 2023/0315306 A1 Oct. 5, 2023

(30) Foreign Application Priority Data
Aug. 31, 2020 (JP) .................................. 2020-146418

(51) Int. Cl.
*G06F 3/06* (2006.01)
(52) U.S. Cl.
CPC .......... *G06F 3/0622* (2013.01); *G06F 3/0659* (2013.01); *G06F 3/0673* (2013.01)

(58) Field of Classification Search
CPC ..... G06F 3/0622; G06F 3/0659; G06F 3/0673
See application file for complete search history.

(56) References Cited

U.S. PATENT DOCUMENTS

2012/0166169 A1* 6/2012 Lu .................... G06F 30/331
703/14

FOREIGN PATENT DOCUMENTS

| JP | 2012-243149 A | 12/2012 |
|---|---|---|
| WO | 2016/155323 A1 | 10/2016 |
| WO | 2017/176217 A1 | 10/2017 |

OTHER PUBLICATIONS

International Search Report and Written Opinion of PCT Application No. PCT/JP2021/029021, issued on Oct. 19, 2021, 08 pages of ISRWO.

(Continued)

*Primary Examiner* — Mark A Giardino, Jr.
(74) *Attorney, Agent, or Firm* — CHIP LAW GROUP

(57) ABSTRACT

A logic simulation device according to an aspect of the present disclosure includes an operation model of a resistance-change memory element. The resistance-change memory element is provided between two terminals. The operation model includes a register section for holding data, a truth table, and a determining section. The truth table defines a relationship between signal values of the two terminals, and data writing to the register section and data reading from the register section. The determining section performs determination about the data writing and the data reading on the basis of signal values inputted to the two terminals and the truth table.

7 Claims, 13 Drawing Sheets

(56) References Cited

OTHER PUBLICATIONS

Akou, et al., "A behavioral model of unipolar resistive RAMs and its application to HSPICE integration", Institute of Electronics, Information and Communication Engineers, (IEICE) Electronics Express, vol. 7, No. 19, Oct. 10, 2010, pp. 1467-1473.

\* cited by examiner

[ FIG. 1 ]
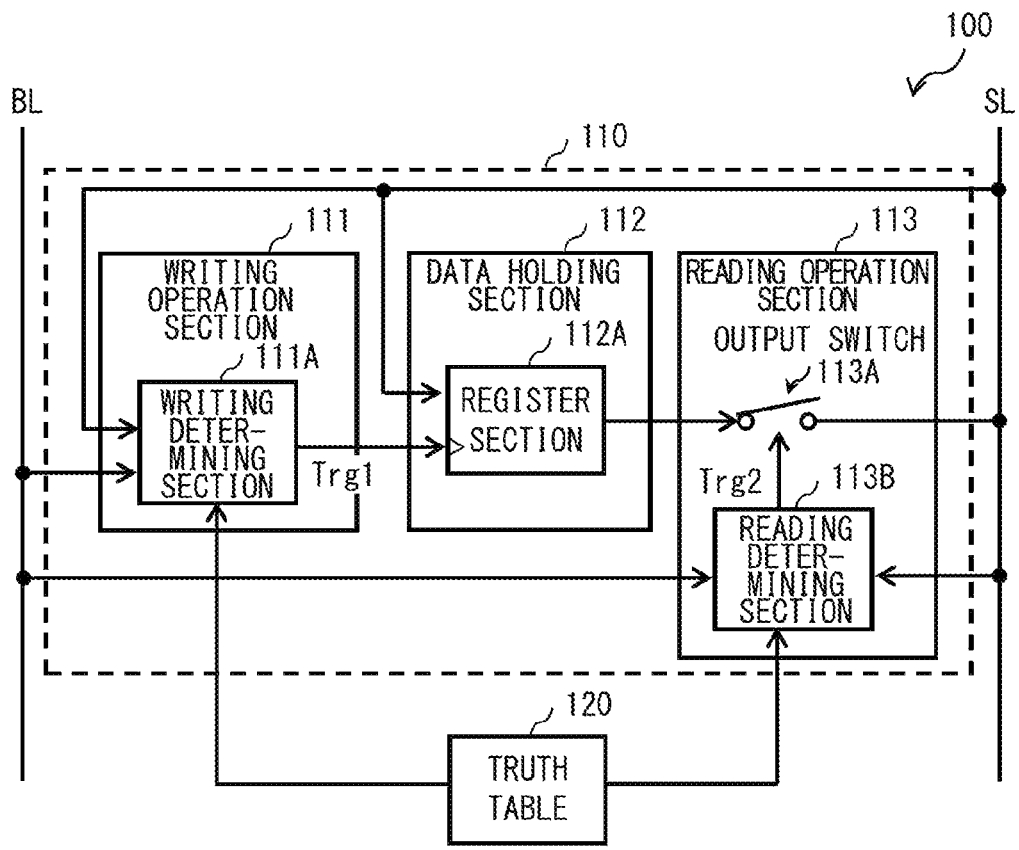
[ FIG. 2 ]

[ FIG. 3 ]
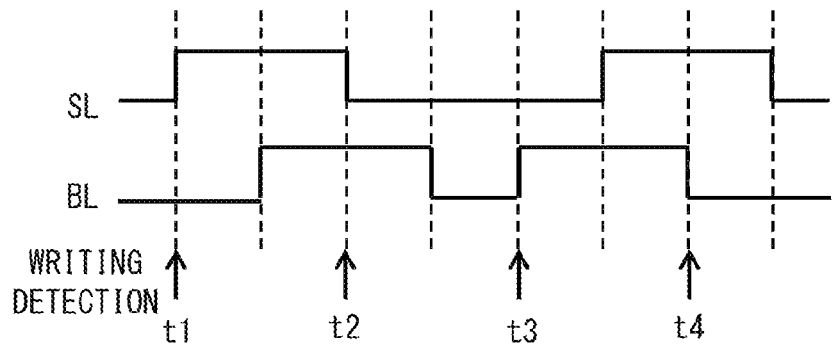
[ FIG. 4 ]
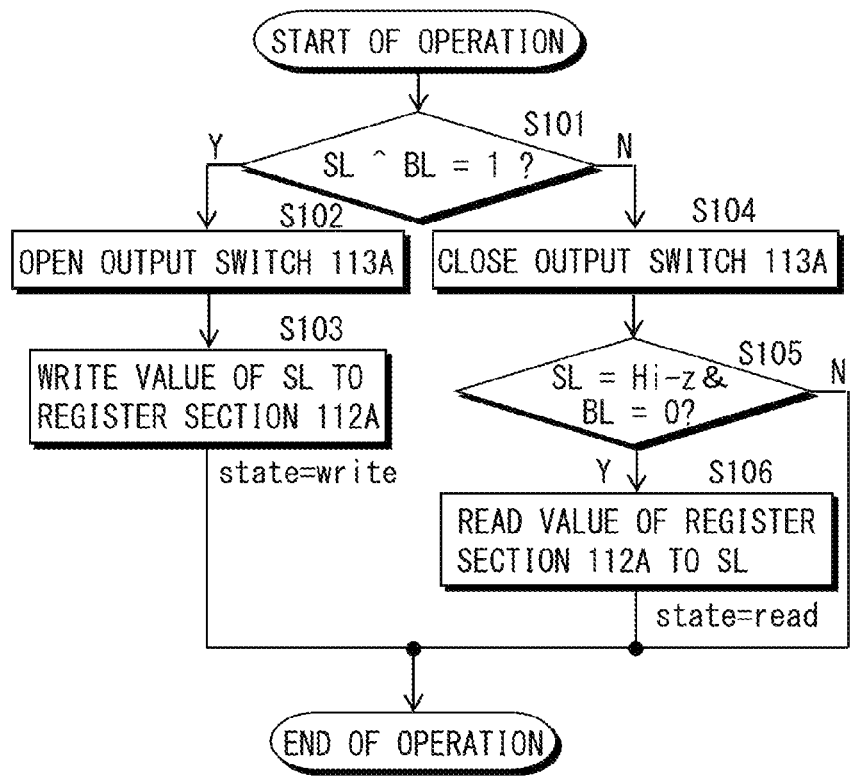

[ FIG. 5 ]
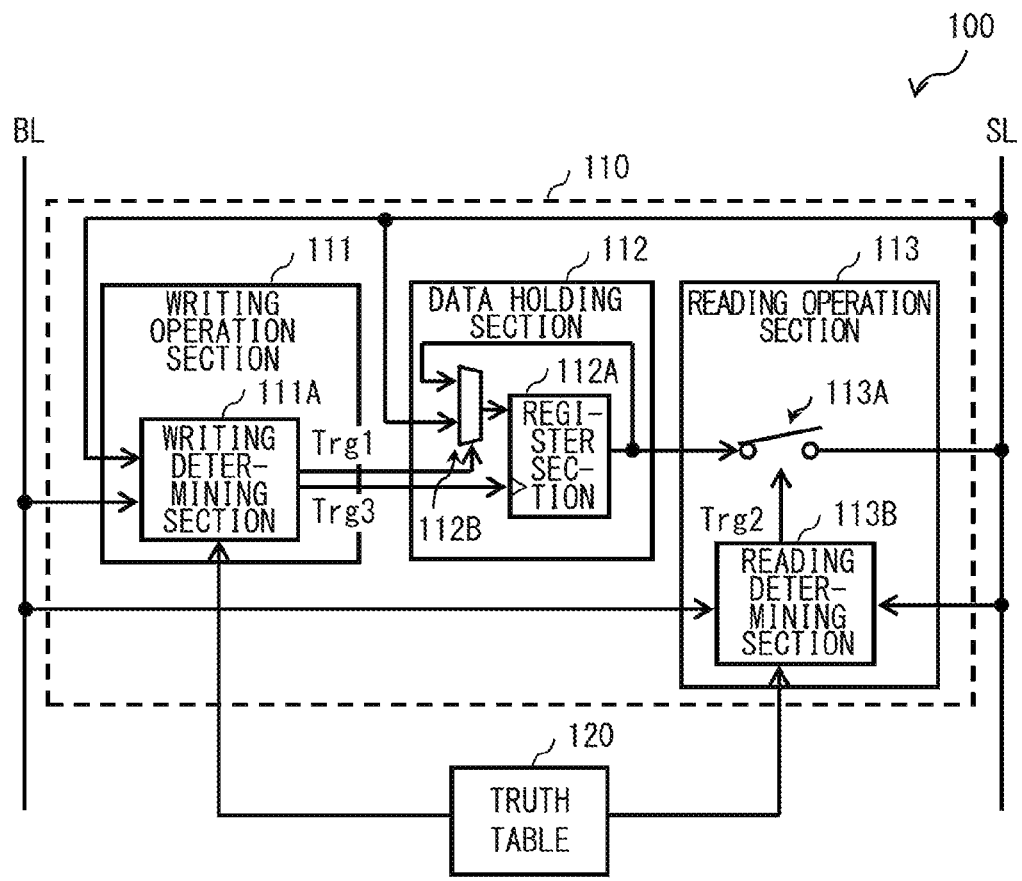
[ FIG. 6 ]
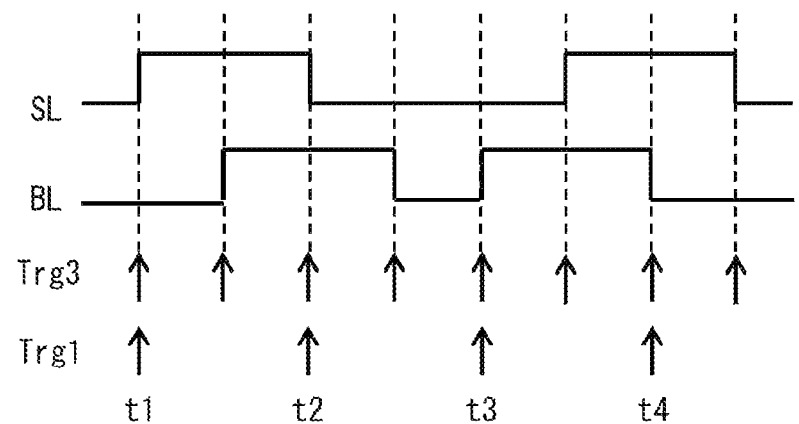

[ FIG. 7 ]
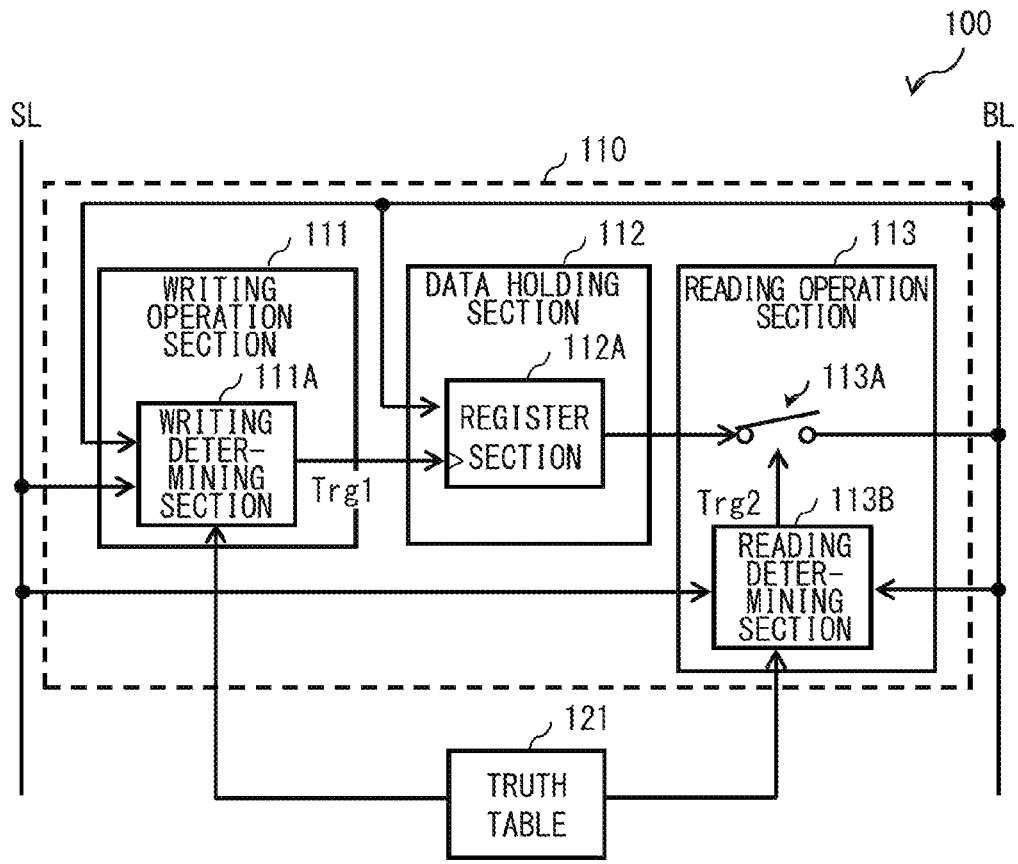
[ FIG. 8 ]

[ FIG. 9 ]
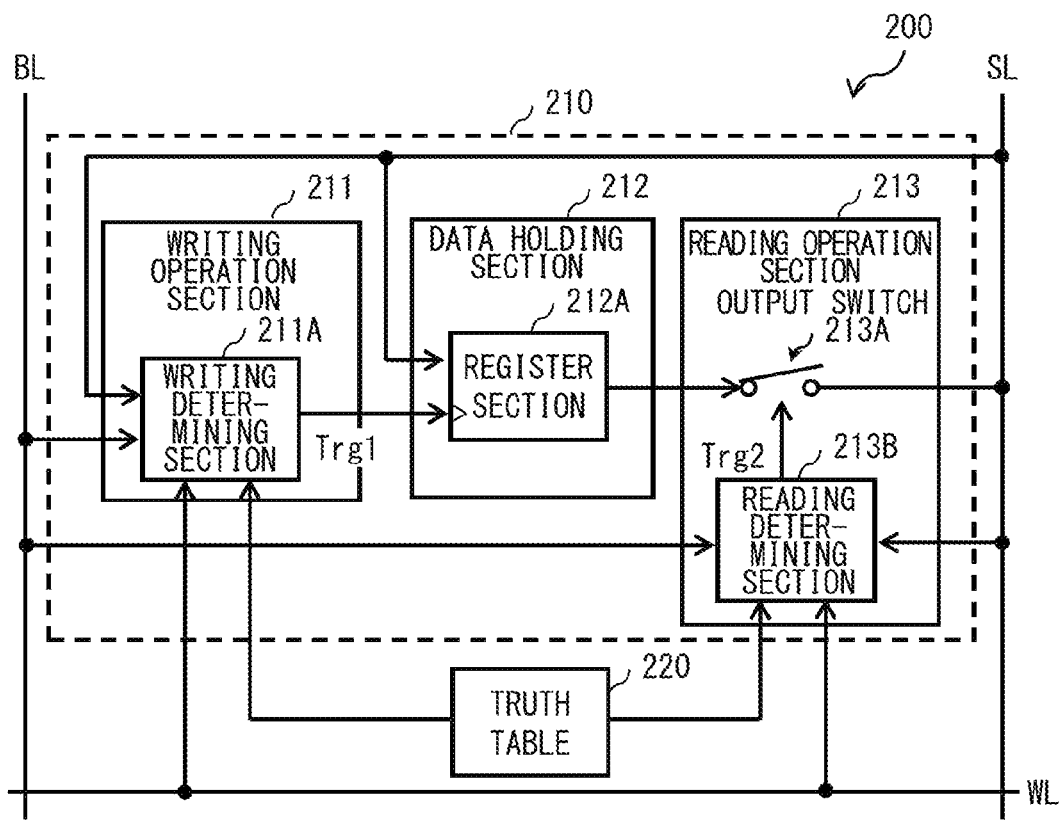
[ FIG. 10 ]
| OPERA-TION | INPUT | | | REGISTER VALUE | OUTPUT |
|---|---|---|---|---|---|
| | WL | SL | BL | | SL |
| 1 write | 1 | 1 | 0 | 1 | Hi-z |
| 0 write | 1 | 0 | 1 | 0 | Hi-z |
| read | 1 | Hi-z | 0 | 1 | 1 |
| | | | | 0 | 0 |
| NON-SELECTION | 0 | – | – | – | Hi-z |

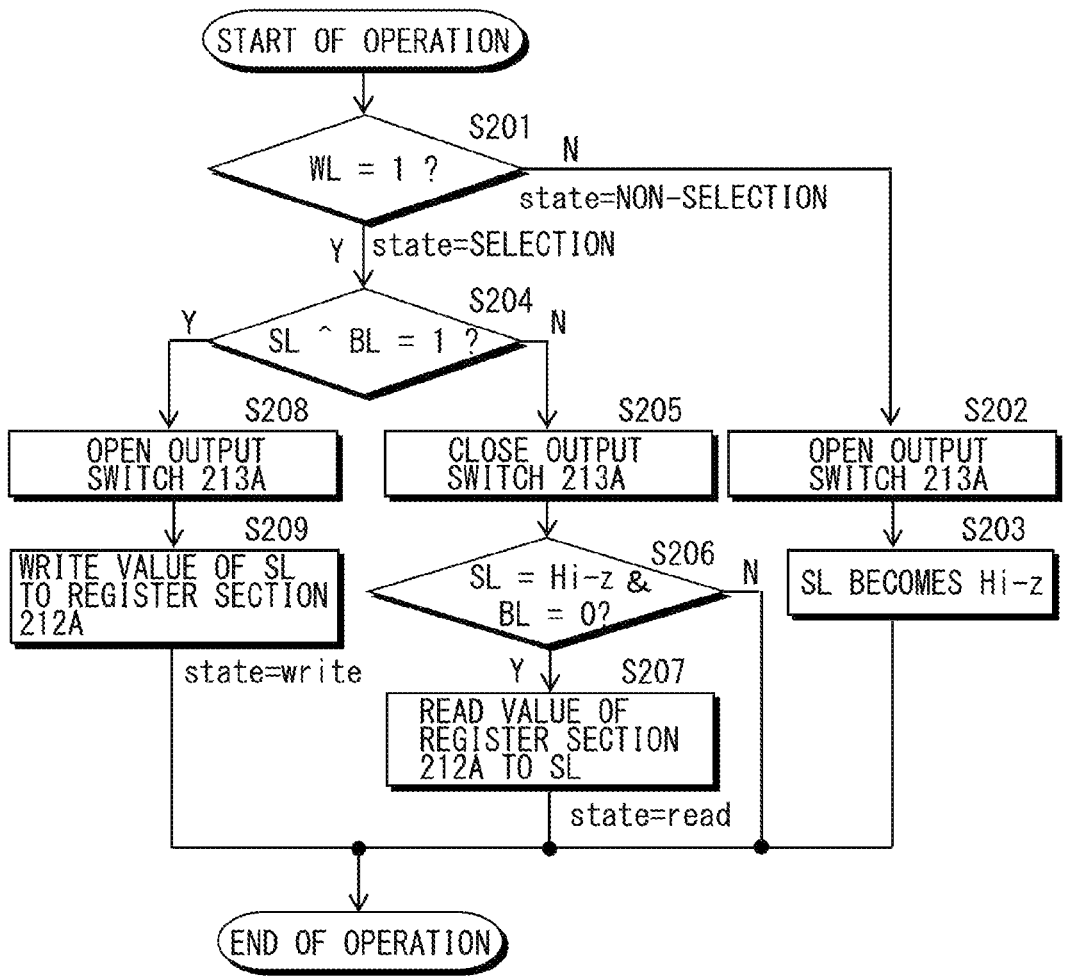
[ FIG. 11 ]

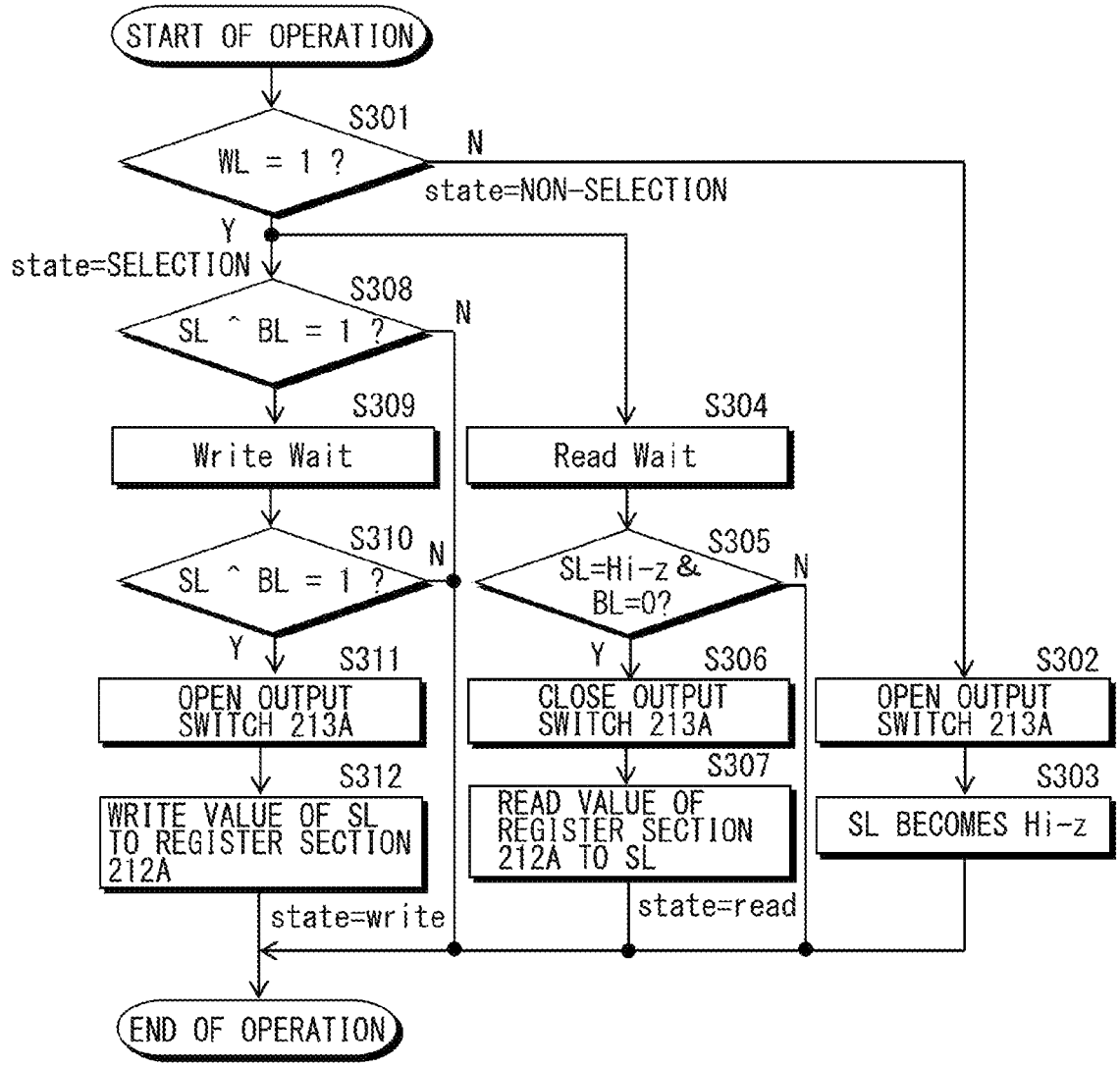
[FIG. 12]

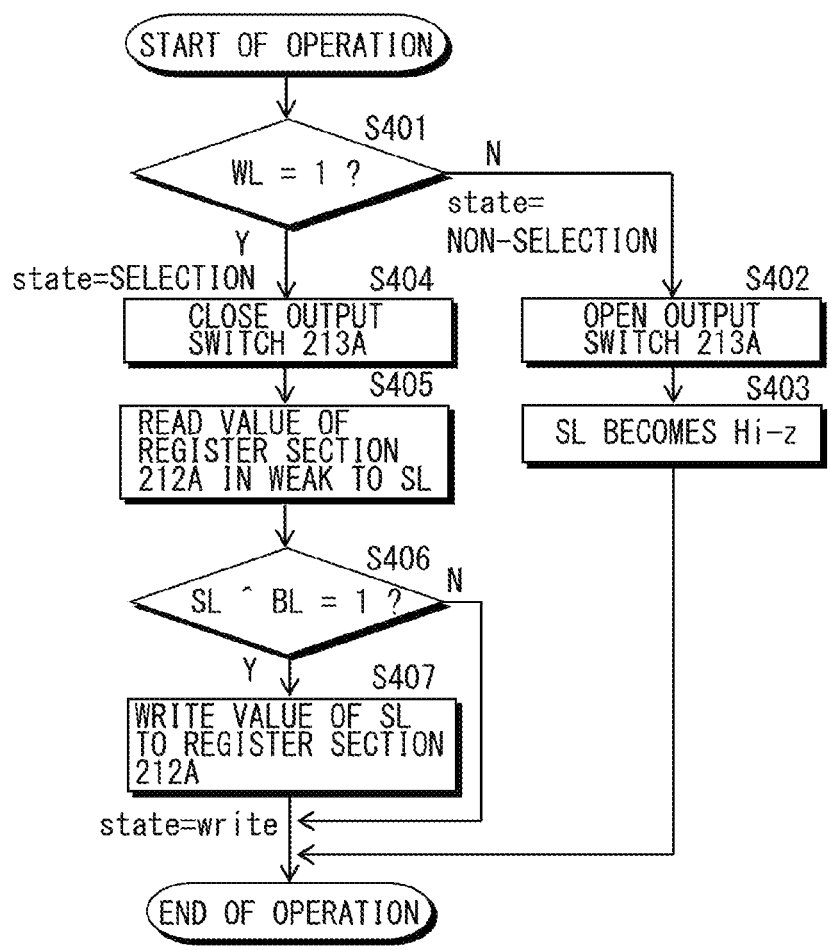
[ FIG. 13 ]

[ FIG. 14 ]
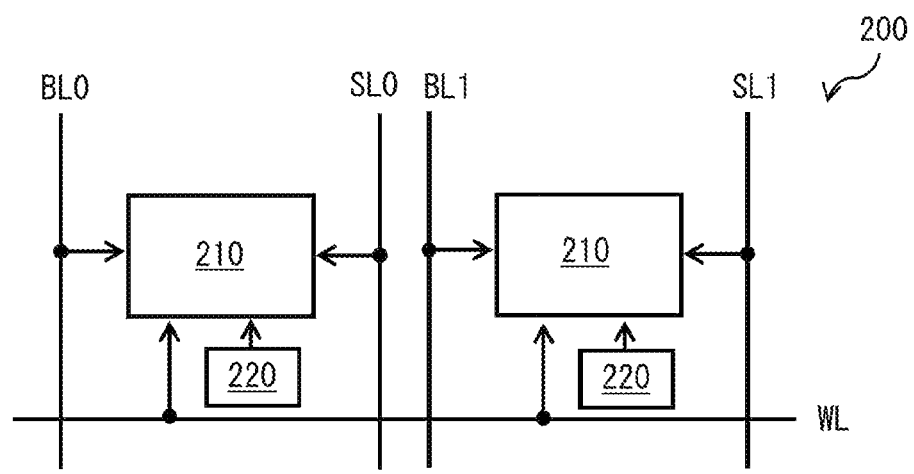
[ FIG. 15 ]
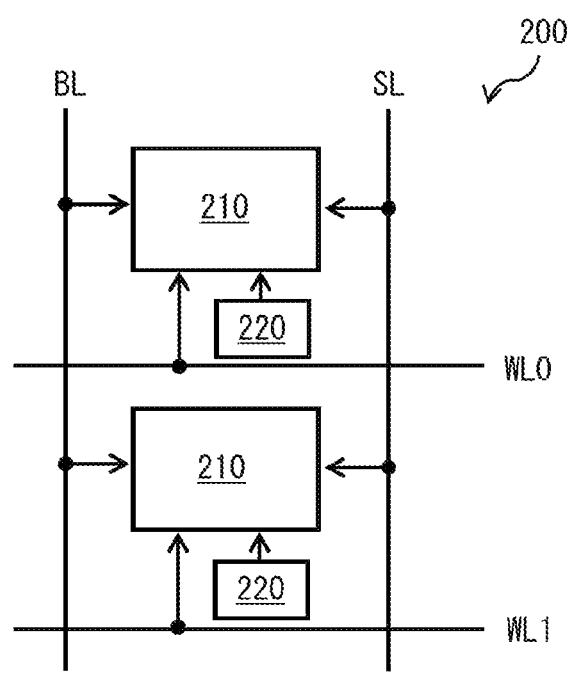

[ FIG. 16 ]
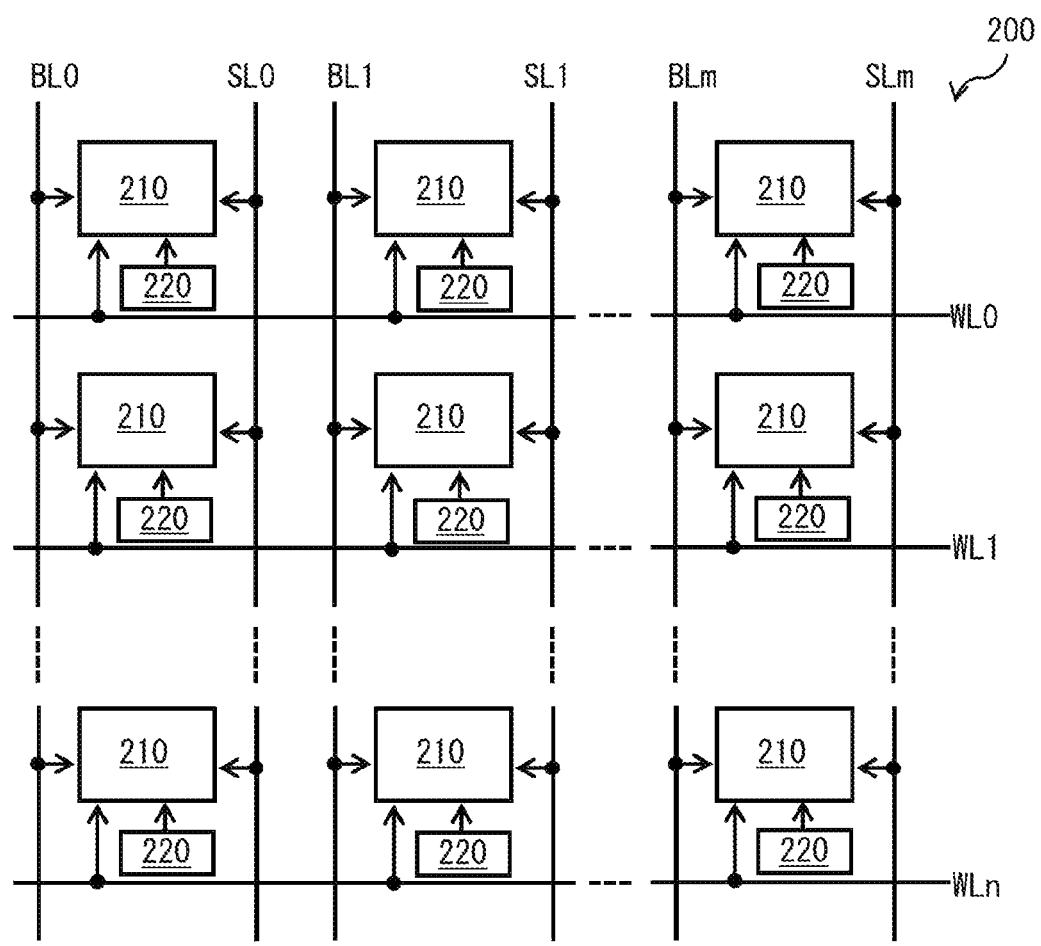

[ FIG. 17 ]
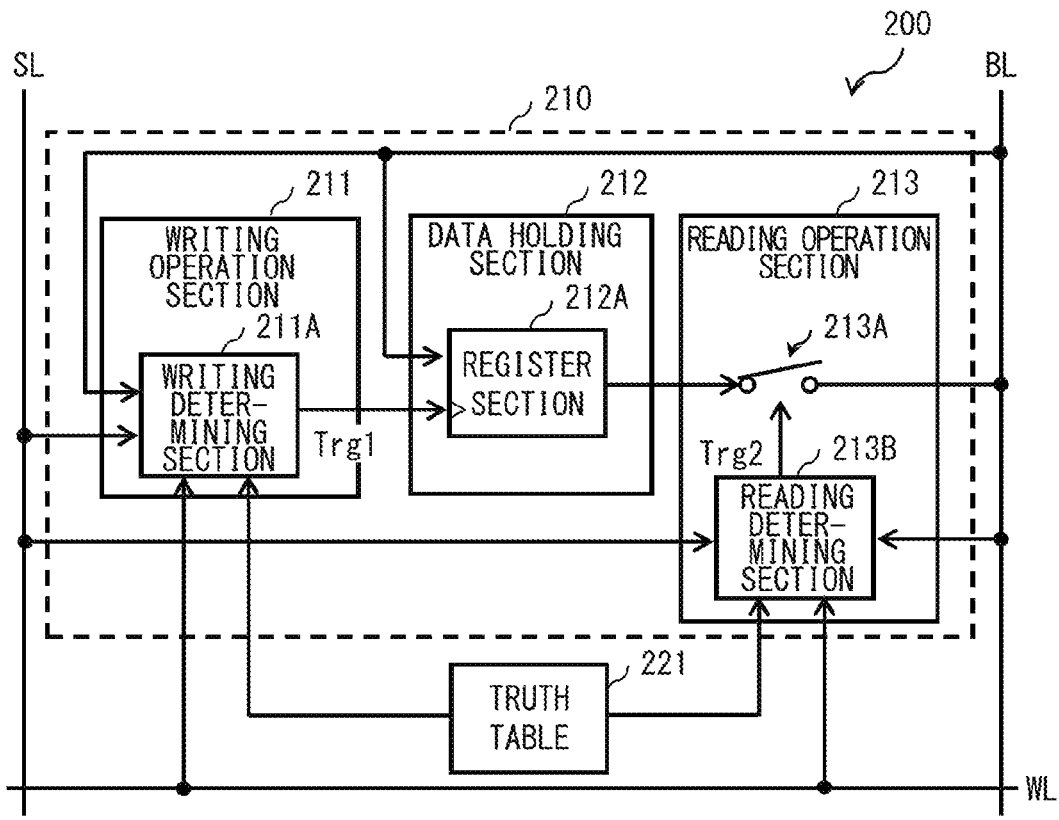
[ FIG. 18 ]
| OPERA-TION | INPUT | | | REGISTER VALUE | OUTPUT |
|---|---|---|---|---|---|
| | WL | SL | BL | | BL |
| 1 write | 1 | 1 | 0 | 1 | Hi-z |
| 0 write | 1 | 0 | 1 | 0 | Hi-z |
| read | 1 | 0 | Hi-z | 1 | 1 |
| | | | | 0 | 0 |
| NON-SELECTION | 0 | – | – | – | Hi-z |

[ FIG. 19 ]
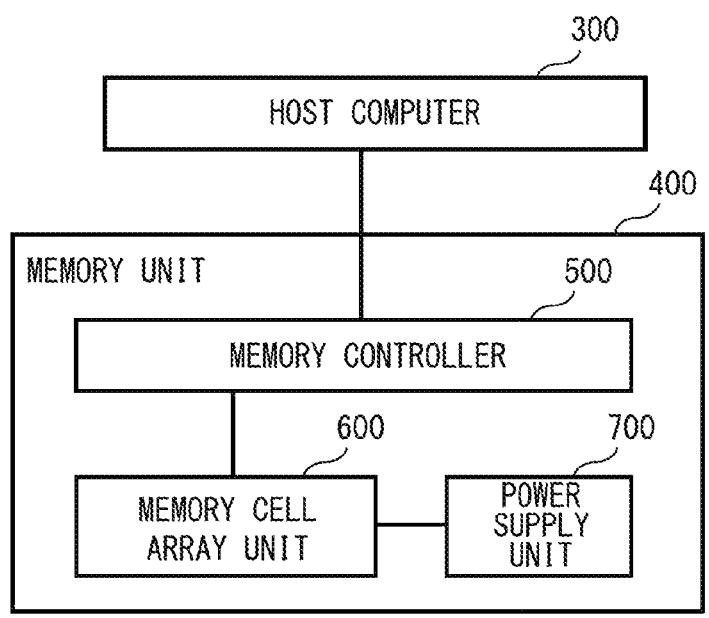

[ FIG. 20 ]
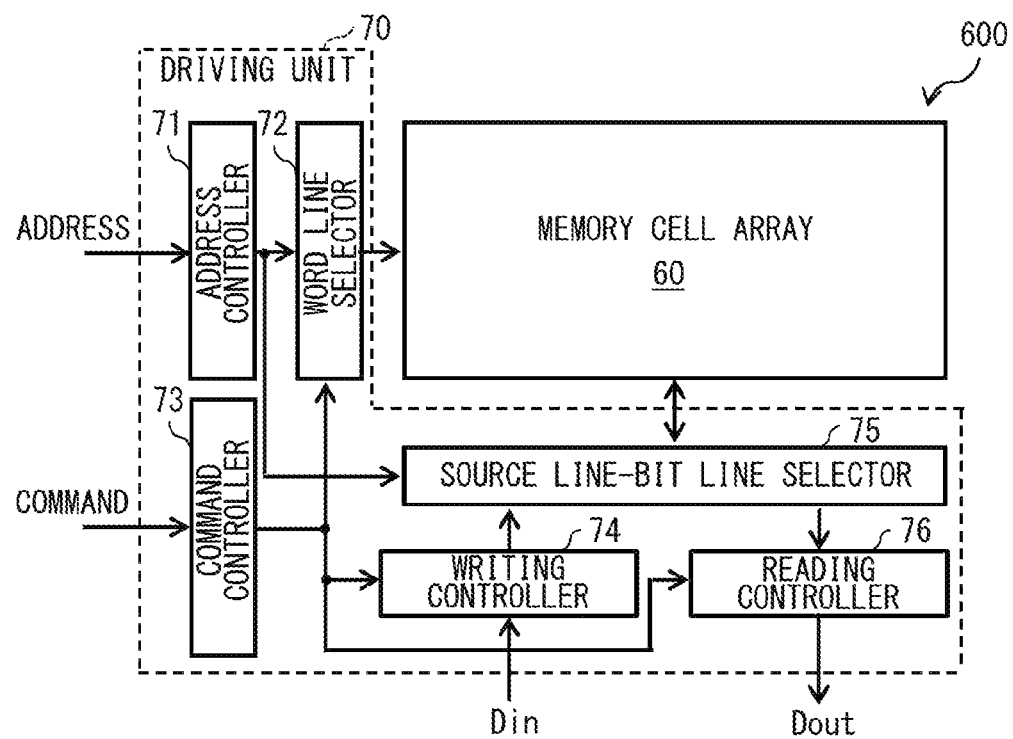

LOGIC SIMULATION DEVICE

CROSS REFERENCE TO RELATED APPLICATIONS

This application is a U.S. National Phase of International Patent Application No. PCT/JP2021/029021 filed on Aug. 4, 2021, which claims priority benefit of Japanese Patent Application No. JP 2020-146418 filed in the Japan Patent Office on Aug. 31, 2020. Each of the above-referenced applications is hereby incorporated herein by reference in its entirety.

TECHNICAL FIELD

The present disclosure relates to a logic simulation device and a logic simulation program.

BACKGROUND ART

In designing a memory circuit including a plurality of resistance-change memory elements, in order to verify correct access to a resistance-change memory element at a specified address, a simulation in which the memory circuit is modeled is performed (for example, see PTL 1).

CITATION LIST

Patent Literature

PTL 1: Japanese Unexamined Patent Application Publication No. 2012-243149

SUMMARY OF THE INVENTION

Incidentally, in a logic simulation device, in a case where a resistance-change memory element is represented by a resistance logic element, the signal level of the resistance-change memory element is representable only by two states of 0 and 1. This causes an issue that it is not possible to reproduce data writing to the resistance-change memory element and data reading from the resistance-change memory element. It is therefore desirable to provide a logic simulation device and a logic simulation program that make it possible to reproduce data writing to a resistance-change memory element and data reading from the resistance-change memory element.

A logic simulation device according to an aspect of the present disclosure includes an operation model of a resistance-change memory element. The resistance-change memory element is provided between two terminals. The operation model includes a register section for holding data, a truth table, and a determining section. The truth table defines a relationship between signal values of the two terminals, and data writing to the register section and data reading from the register section. The determining section performs determination about the data writing and the data reading on the basis of signal values inputted to the two terminals and the truth table.

A logic simulation program according to an aspect of the present disclosure includes a logic simulation program of a resistance-change memory element. The resistance-change memory element is provided between two terminals. The logic simulation program causes a computer to execute performing determination about data writing to a register section for holding data and data reading from the register section on the basis of a truth table and signal values inputted to the two terminals, the truth table defining a relationship between signal values of the two terminals, and the data writing and the data reading.

In the logic simulation device and the logic simulation program according to the aspects of the present disclosure, determination about the data writing and the data reading is performed on the basis of the signal values inputted to the two terminals and the truth table. Therefore, for example, even in a case where signals are applied to both ends of the resistance-change memory element, signal collision such as a resistance logic element does not occur.

BRIEF DESCRIPTION OF DRAWINGS

FIG. 1 is a diagram illustrating an example of functional blocks of an operation model according to a first embodiment of the present disclosure.

FIG. 2 is a diagram illustrating an example of a truth table in the operation model in FIG. 1.

FIG. 3 is a diagram illustrating an example of signal waveforms in the operation model in FIG. 1.

FIG. 4 is a diagram illustrating an example of an operation in the operation model in FIG. 1.

FIG. 5 is a diagram illustrating a modification example of the functional blocks of the operation model in FIG. 1.

FIG. 6 is a diagram illustrating an example of signal waveforms in the operation model in FIG. 5.

FIG. 7 is a diagram illustrating a modification example of the functional blocks of the operation model in FIG. 1.

FIG. 8 is a diagram illustrating an example of a truth table in the operation model in FIG. 7.

FIG. 9 is a diagram illustrating an example of functional blocks of an operation model according to a second embodiment of the present disclosure.

FIG. 10 is a diagram illustrating an example of a truth table in the operation model in FIG. 9.

FIG. 11 is a diagram illustrating an example of an operation in the operation model in FIG. 9.

FIG. 12 is a diagram illustrating a modification example of the operation in the operation model in FIG. 9.

FIG. 13 is a diagram illustrating a modification example of the operation in the operation model in FIG. 9.

FIG. 14 is a diagram illustrating a modification example of the functional blocks of the operation model in FIG. 9.

FIG. 15 is a diagram illustrating a modification example of the functional blocks of the operation model in FIG. 9.

FIG. 16 is a diagram illustrating a modification example of the functional blocks of the operation model in FIG. 9.

FIG. 17 is a diagram illustrating a modification example of the functional blocks of the operation model in FIG. 9.

FIG. 18 is a diagram illustrating an example of a truth table in the operation model in FIG. 17.

FIG. 19 is a diagram illustrating a schematic configuration example of an information processing system including the operation model in FIG. 1, FIG. 5, FIG. 7, FIG. 9, FIG. 14, FIG. 15, FIG. 16, or FIG. 17.

FIG. 20 is a diagram illustrating an example of functional blocks of a memory cell array unit in FIG. 19.

MODES FOR CARRYING OUT THE INVENTION

In the following, some embodiments of the present disclosure are described with reference to the drawings. It is to be noted that in this specification and the drawings, components that have substantially the same functional configuration are indicated by the same reference signs, and thus redundant description thereof is omitted.

1. First Embodiment (Operation model)
An example in which a resistance-change memory element is provided between a BL and a SL . . . FIGS. 1 to 4
2. Modification Examples of First Embodiment (Operation model)
Modification Example A: An example in which a selector is provided in a data holding section . . . FIGS. 5 and 6
Modification Example B: An example the BL and the SL are reversed . . . FIGS. 7 and 8
3. Second Embodiment (Operation model)
An example in which a WL is further provided . . . FIGS. 9 to 11
4. Modification Examples of Second Embodiment (Operation model)
Modification Example C: An example in which wait time is provided for writing and reading . . . FIG. 12
Modification Example D: An example of outputting in Weak . . . FIG. 13
Modification Example E: An example in which a plurality of resistance-change elements is provided . . . FIGS. 14 to 16
Modification Example F: An example in which the BL and the SL are reversed . . . FIGS. 17 and 18
5. Application Example (Information processing system)
An example in which the operation model described above is applied to an information processing system . . . FIGS. 19 and 20

1. First Embodiment

Configuration

FIG. 1 illustrates an example of functional blocks of an operation model 100 according to a first embodiment of the present disclosure. The operation model 100 corresponds to a specific example of a portion of a "logic simulation device" or a specific example of portion of a "logic simulation program" in the present disclosure. The operation model 100 is provided between two terminals (a bit line BL and a source line SL). The operation model 100 is a model in which a resistance-change memory element is represented by a logic element. The operation model 100 includes, for example, a resistance-change memory element 110 and a truth table 120, as illustrated in FIG. 1.

In a case where the operation model 100 corresponds to a specific example of a portion of a "logic simulation device" in the present disclosure, the resistance-change memory element 110 is configured by hardware that implements a function of the resistance-change memory element 110, and the truth table 120 is stored in, for example, a volatile memory such as a DRAM (Dynamic Random Access Memory) or a non-volatile memory such as an EEPROM (Electrically Erasable Programmable Read-Only Memory) or a flash memory. In a case where the operation model 100 corresponds to a specific example of a portion of a "logic simulation program" in the present disclosure, the operation model 100 is stored in, for example, a volatile memory such as a DRAM or a non-volatile memory such as an EEPROM or a flash memory, and the operation model 100 is loaded on a CPU (Central Processing Unit), thereby causing the CPU to implement the function of the operation model 100.

The resistance-change memory element 110 is provided between the bit line BL and the source line SL. The resistance-change memory element 110 includes, for example, a writing operation section 111, a data holding section 112, and a reading operation section 113.

The writing operation section 111 controls data writing to the data holding section 112. The writing operation section 111 includes, for example, a writing determining section 111A as illustrated in FIG. 1. The bit line BL and the source line SL are coupled to the writing determining section 111A. The writing determining section 111A performs determination about data writing to the data holding section 112 (a register section 112A to be described later) on the basis of signal values inputted to the bit line BL and the source line SL and the truth table 120. When the writing determining section 111A determines that data writing to the data holding section (the register section 112A) is specified, on the basis of data inputted to the bit line BL and the source line SL and the truth table 120, the writing determining section 111A outputs, to the data holding section 112 (the register section 112A), a control signal Trg1 for writing a signal value inputted to the source line SL to the data holding section 112 (the register section 112A).

FIG. 2 illustrates a specific example of the truth table 120. The truth table 120 includes data defining a relationship between signal values of the bit line BL and the source line SL, and data writing to the register section 112A and data reading from the register section 112A. The truth table 120 defines, for example, three types of operation modes including a "1 write" operation, a "0 write" operation, and a "read" operation, as illustrated in FIG. 2.

In the "1 write" operation, it is defined that when the signal value of the source line SL is "1" and the signal value of the bit line BL is "0", "1" is written as a register value to the register section 112A. When the "1 write" operation is executed, "Hi-z" (a value corresponding to high impedance) is outputted from the resistance-change memory element 110 to the source line SL.

In the "0 write" operation, it is defined that when the signal value of the source line SL is "0" and the signal value of the bit line BL is "1", "0" is written as a register value to the register section 112A. When the "0 write" operation is executed, "Hi-z" is outputted from the resistance-change memory element 110 to the source line SL.

In the "read" operation, it is defined that when the signal value of the source line SL is "Hi-z" and the signal value of the bit line BL is "0", "1" or "0" is read as a register value from the register section 112A. When the "read" operation is executed, the register value ("1" or "0") is read from the resistance-change memory element 110 to the source line SL.

The writing determining section 111A determines to which one of the plurality of operation modes defined by the truth table 120 the data (the signal values) inputted to the bit line BL and the source line SL corresponds. As a result, the writing determining section 111A performs control corresponding to the corresponding operation mode on the data holding section 112 (the register section 112A). For example, when the signal value of the source line SL is "1" and the signal value of the bit line BL is "0", the writing determining section 111A determines that the "1 write" operation is specified, and outputs, to the register section 112A, the control signal Trg1 for writing the data (the signal value) (="1") inputted to the source line SL as a register value to the register section 112A. For example, when the signal value of the source line SL is "0" and the signal value of the bit line BL is "1", the writing determining section 111A determines that the "0 write" operation is specified and outputs, to the register section 112A, the control signal Trg1 for writing the data (the signal value) (="0") inputted to the source line SL as a register value to the register section 112A. For example, when the signal value of the source line SL is "Hi-z" and the signal value of the bit line BL is "0", the writing determining section 111A determines that the "read" operation is specified, and does not output the control signal Trg1 but outputs a constant voltage lower than a threshold value to the register section 112A. The threshold value is used for detection of the control signal Trg1 in the register section 112A.

The data holding section 112 holds the signal value of the source line SL in accordance with control by the writing determining section 111A. The data holding section 112 includes, for example, the register section 112A as illustrated in FIG. 1. The source line SL is coupled to the register section 112A. The register section 112A uses, as a trigger, the control signal Trg1 inputted from the writing determining section 111A to receive the signal value of the source line SL and store the signal value as a register value. The register section 112A outputs "Hi-z" to the reading operation section 113 upon the "1 write" operation or the "0 write" operation. The register section 112A outputs the register value to the reading operation section 113 upon the "read" operation.

The reading operation section 113 includes, for example, an output switch 113A and a reading determining section 113B as illustrated in FIG. 1. The output switch 113A is coupled to an output end of the register section 112A and the source line SL, and performs connection and disconnection between the output end of the register section 112A and the source line SL in accordance with a control signal Trg2 from the reading determining section 113B.

The reading determining section 113B controls data reading to the source line SL. The bit line BL and the source line SL are coupled to the reading determining section 113B. The reading determining section 113B performs determination about data reading from the register section 112A to the source line SL on the basis of the signal values inputted to the bit line BL and the source line SL and the truth table 120. When the reading determining section 113B determines that data reading is specified, on the basis of data inputted to the bit line BL and the source line SL and the truth table 120, the reading determining section 113B outputs, to the output switch 113A, the control signal Trg2 for reading the register value from the register section 112A to the source line SL. In a case where the control signal Trg2 for reading the register value is inputted from the reading determining section 113B to the output switch 113A, the output switch 113A couples the output end of the register section 112A and the source line SL to each other.

The reading determining section 113B determines to which one of the plurality of operation modes defined by the truth table 120 the data (the signal values) inputted to the bit line BL and the source line SL corresponds. As a result, the reading determining section 113B performs control corresponding to the corresponding operation mode on the output switch 113A.

For example, when the signal value of the source line SL is "1" and the signal value of the bit line BL is "0", the reading determining section 113B determines that the "1 write" operation is specified, and outputs, to the output switch 113A, the control signal Trg2 for turning off the output switch 113A. At this time, the output switch 113A is turned off, which causes the output end of the register section 112A (an output end of the resistance-change memory element 110) to be opened to the source line SL.

For example, when the signal value of the source line SL is "0" and the signal value of the bit line BL is "1", the reading determining section 113B determines that the "0 write" operation is specified, and outputs, to the output switch 113A, the control signal Trg2 for turning off the output switch 113A. At this time, the output switch 113A is turned off, which causes the output end of the register section 112A (the output end of the resistance-change memory element 110) to be opened to the source line SL.

For example, when the signal value of the source line SL is "Hi-z" and the signal value of the bit line BL is "0", the reading determining section 113B determines that the "read" operation is specified, and outputs, to the output switch 113A, the control signal Trg2 for turning on the output switch 113A. At this time, the output switch 113A is turned on, which couples the output end of the register section 112A (the output end of the resistance-change memory element 110) to the source line SL. As a result, the register value ("1" or "0") held in the register section 112A is read to the source line SL.

FIG. 3 illustrates an example of signal waveforms of the operation model 100. It is assumed that the signal value of the source line SL cyclically changes to "0"→"1"→"0"→"1", and the signal value of the bit line BL cyclically changes to "0"→"1"→"0"→"1" and is shifted by a half cycle from the cycle of the signal value of the source line SL. For example, when the signal value of the bit line BL is "0", "1 write" is detected by the writing determining section 111A at a timing (t1) at which the signal value of the source line SL changes from "0" to "1". At this time, the signal value (="1") of the source line SL is written to the register section 112A. For example, when the signal value of the bit line BL is "1", "0 write" is detected by the writing determining section 111A at a timing (t2) at which the signal value of the source line SL changes from "1" to "0". At this time, the signal value (="0") of the source line SL is written to the register section 112A.

For example, when the signal value of the source line SL is "0", "0 write" is detected by the writing determining section 111A at a timing (t3) at which the signal value of the bit line BL changes from "0" to "1". At this time, the signal value (="0") of the source line SL is written to the register section 112A. For example, when the signal value of the source line SL is "1", "1 write" is detected by the writing determining section 111A at a timing (t4) at which the signal value of the bit line BL changes from "1" to "0". At this time, the signal value (="1") of the source line SL is written to the register section 112A.

FIG. 4 illustrates an example of an operation in the operation model 100. The operation model 100 determines whether or not an exclusive-OR of the signal value of the source line SL and the signal value of the bit line BL is "1" (step S101). As a result, when the exclusive-OR described above is "1", the operation model 100 opens the output switch 113A (step S102). At this time, the operation model 100 writes the signal value of the source line SL to the register section 112A (step S103). Meanwhile, when the exclusive-OR described above is not 1, the operation model 100 closes the output switch 113A (step S104). Subsequently, the operation model 100 determines whether or not the signal value of the source line SL is "Hi-z" and the signal value of the bit line BL is "0" (step S105). As a result, when the signal value of the source line SL is not "Hi-z" or the signal value of the bit line BL is not "0", the operation model 100 ends the operation. Meanwhile, when the signal value of the source line SL is "Hi-z", and the signal value of the bit line BL is "0", the operation model 100 reads the value (the register value) of the register section 112A to the source line SL (step S106), and ends the operation.

Effects

Next, description is given of effects of the operation model 100.

In designing a memory circuit including a plurality of resistance-change memory elements, in order to verify correct access to a resistance-change memory element at a specified address, a simulation in which the memory circuit is modeled is performed. Incidentally, in a logic simulation device, in a case where a resistance-change memory element is represented by a resistance logic element, the signal level of the resistance-change memory element is representable only by two states of 0 and 1. This causes an issue that it is not possible to reproduce data writing to the resistance-change memory element and data reading from the resistance-change memory element.

Meanwhile, in the present embodiment, determination about data writing and data reading is performed on the basis of the signal values inputted to the bit line BL and the source line SL and the truth table 120. Thus, for example, even in a case where signals are applied to both ends of the resistance-change memory element 110, signal collision such as a resistance logic element does not occur. It is therefore possible to reproduce data writing to the resistance-change memory element and data reading from the resistance-change memory element in a logic simulation.

In addition, in the present embodiment, when it is determined that data writing is specified, on the basis of the signal values inputted to the bit line BL and the source line SL and the truth table 120, the signal value inputted to the source line SL is written as a register value to the register section 112A. Thus, for example, even in a case where signals are applied to both ends of the resistance-change memory element 110, signal collision such as a resistance logic element does not occur. It is therefore possible to reproduce data writing to the resistance-change memory element in a logic simulation.

In addition, in the present embodiment, when it is determined that data reading is specified, on the basis of the signal values inputted to the bit line BL and the source line SL and the truth table 120, the register value held in the register section 112A is outputted to the source line SL. Thus, for example, even in a case where signals are applied to both ends of the resistance-change memory element 110, signal collision such as a resistance logic element does not occur. It is therefore possible to reproduce data reading from the resistance-change memory element in a logic simulation.

2. Modification Examples of First Embodiment

Modification Example A

In the embodiment described above, for example, as illustrated in FIG. 5, a selector 112B may be provided in the data holding section 112. The selector 112B controls a signal value to be inputted to the register section 112A. The source line SL and the output end of the register section 112A are coupled to the selector 112B. The selector 112B controls the signal value to be inputted to the register section 112A on the basis of the signal value of the source line SL and an output value of the register section 112A. The selector 112B controls, by the control signal Trg1 inputted from the writing determining section 111A, one of the signal value of the source line SL and the output value of the register section 112A as a signal value to be inputted to the register section 112A. For example, in a case where the source line SL is selected by the control signal Trg1, the selector 112B inputs (writes) the signal value of the source line SL to the register section 112A. For example, in a case where the output value of the register section 112A is selected, the selector 112B inputs (writes) an output signal value of the register section 112A to the register section 112A.

For example, the selector 112B uses the control signal Trg1 inputted from the writing determining section 111A as a trigger to receive the signal value of the source line SL and the output value of the register section 112A and control the signal value to be inputted to the register section 112A on the basis of two received values. For example, in a case where the signal value of the source line SL and the output value of the register section 112A are different from each other, the selector 112B inputs (writes) the signal value of the source line SL to the register section 112A. For example, in a case where the signal value of the source line SL and the output value of the register section 112A are equal to each other, the selector 112B does not perform input (writing) to the register section 112A. Thus, writing to the register section 112A is omitted.

In the present modification example, the writing determining section 111A performs not only determination about data writing but also determination of whether or not the signal value of one of the source line SL and the bit line BL changes. When the writing determining section 111A determines that the signal value of one of the source line SL and the bit line BL changes, the writing determining section 111A outputs, to the register section 112A, a control signal Trg3 for controlling data writing to the register section 112A.

FIG. 6 illustrates an example of signal waveforms in the operation model 100 according to the present modification example. It is assumed that the signal value of the source line SL cyclically changes to "0"→"1"→"0"→"1", and the signal value of the bit line BL cyclically changes to "0"→"1"→"0"→"1" and is shifted by a half cycle from the cycle of the signal value of the source line SL. For example, when the signal value of the bit line BL is "0", "1 write" is detected by the writing determining section 111A at the timing (t1) at which the signal value of the source line SL changes from "0" to "1". At this time, the control signal Trg1 is outputted from the writing determining section 111A to the selector 112B, and the control signal Trg3 is outputted from the writing determining section 111A to the register section 112A. As a result, the signal value of the source line SL is outputted from the selector 112B to the register section 112A, and the signal value of the source line SL is written to the register section 112A.

For example, when the signal value of the bit line BL is "1", "0 write" is detected by the writing determining section 111A at the timing (t2) at which the signal value of the source line SL changes from "1" to "0". At this time, the control signal Trg1 is outputted from the writing determining section 111A to the selector 112B, and the control signal Trg3 is outputted from the writing determining section 111A to the register section 112A. As a result, the signal value of the source line SL is outputted from the selector 112B to the register section 112A, and the signal value of the source line SL is written to the register section 112A.

For example, when the signal value of the source line SL is "0", "0 write" is detected by the writing determining section 111A at the timing (t3) at which the signal value of the bit line BL changes from "0" to "1". At this time, the control signal Trg1 is outputted from the writing determining section 111A to the selector 112B, and the control signal Trg3 is outputted from the writing determining section 111A to the register section 112A. As a result, the signal value of the source line SL is outputted from the selector 112B to the register section 112A, and the signal value of the source line SL is written to the register section 112A.

For example, when the signal value of the source line SL is "1", "1 write" is detected by the writing determining section 111A at the timing (t4) at which the signal value of the bit line BL changes from "1" to "0". At this time, the control signal Trg1 is outputted from the writing determining section 111A to the selector 112B, and the control signal Trg3 is outputted from the writing determining section 111A to the register section 112A. As a result, the signal value of the source line SL is outputted from the selector 112B to the register section 112A, and the signal value of the source line SL is written to the register section 112A.

Thus, in the present modification example, writing control similar to that in the embodiment described above is performed. Accordingly, in the present modification example, effects similar to those in the embodiment described above are achieved.

Modification Example B

In the embodiment described above and the modification example thereof, the source line SL and the bit line BL may be reversed. For example, as illustrated in FIG. 7, in the embodiment described above, the source line SL and the bit line BL may be reversed. In this case, a truth table 121 is provided in place of the truth table 120.

FIG. 8 illustrates a specific example of the truth table 121. The truth table 121 includes data defining a relationship between the signal values of the bit line BL and the source line SL, and data writing to the register section 112A and data reading from the register section 112A. The truth table 121 defines, for example, three types of operation modes including the "1 write" operation, the "0 write" operation, and the "read" operation, as illustrated in FIG. 8.

In the "1 write" operation, it is defined that when the signal value of the source line SL is "1" and the signal value of the bit line BL is "0", "1" is written as a register value to the register section 112A. When the "1 write" operation is executed, "Hi-z" is outputted from the resistance-change memory element 110 to the bit line BL.

In the "0 write" operation, it is defined that when the signal value of the source line SL is "0" and the signal value of the bit line BL is "1", "0" is written as a register value to the register section 112A. When the "0 write" operation is executed, "Hi-z" is outputted from the resistance-change memory element 110 to the bit line BL.

In the "read" operation, it is defined that when the signal value of the source line SL is "0" and the signal value of the bit line BL is "Hi-z", "1" or "0" is read as a register value from the register section 112A. When the "read" operation is executed, the register value ("1" or "0") is read from the resistance-change memory element 110 to the bit line BL.

In the present modification example, the writing determining section 111A determines to which one of the plurality of operation modes defined by the truth table 121 the data (the signal values) inputted to the bit line BL and the source line SL corresponds. As a result, the writing determining section 111A performs control corresponding to the corresponding operation mode on the data holding section 112 (the register section 112A). For example, when the signal value of the source line SL is "1" and the signal value of the bit line BL is "0", the writing determining section 111A determines that the "1 write" operation is specified, and outputs, to the register section 112A, the control signal Trg1 for writing the data (the signal value) (="1") inputted to the source line SL as a register value to the register section 112A. For example, when the signal value of the source line SL is "0" and the signal value of the bit line BL is "1", the writing determining section 111A determines that the "0 write" operation is specified and outputs, to the register section 112A, the control signal Trg1 for writing the data (the signal value) (="0") inputted to the source line SL as a register value to the register section 112A. For example, when the signal value of the source line SL is "0" and the signal value of the bit line BL is "Hi-z", the writing determining section 111A determines that the "read" operation is specified, and does not output the control signal Trg1 but outputs a constant voltage lower than a threshold value to the register section 112A. The threshold value is used for detection of the control signal Trg1 in the register section 112A.

In the present modification example, for example, as illustrated in FIG. 7, the output switch 113A is coupled to the output end of the register section 112A and the bit line BL, and performs connection and disconnection between the output end of the register section 112A and the bit line BL in accordance with the control signal Trg2 from the reading determining section 113B.

In the present modification example, the reading determining section 113B controls data reading to the bit line BL. The bit line BL and the source line SL are coupled to the reading determining section 113B. The reading determining section 113B performs determination about data reading from the register section 112A to the bit line BL on the basis of the signal values inputted to the bit line BL and the source line SL and the truth table 121. When the reading determining section 113B determines that data reading is specified, on the basis of data inputted to the bit line BL and the source line SL and the truth table 121, the reading determining section 113B outputs, to the output switch 113A, the control signal Trg2 for reading the register value from the register section 112A to the bit line BL. In a case where the control signal Trg2 for reading the register value is inputted from the reading determining section 113B to the output switch 113A, the output switch 113A couples the output end of the register section 112A and the bit line BL to each other.

The reading determining section 113B determines to which one of the plurality of operation modes defined by the truth table 121 the data (the signal values) inputted to the bit line BL and the source line SL corresponds. As a result, the reading determining section 113B performs control corresponding to the corresponding operation mode on the output switch 113A.

For example, when the signal value of the source line SL is "1" and the signal value of the bit line BL is "0", the reading determining section 113B determines that the "1 write" operation is specified, and outputs, to the output switch 113A, the control signal Trg2 for turning off the output switch 113A. At this time, the output switch 113A is turned off, which causes the output end of the register section 112A (the output end of the resistance-change memory element 110) to be opened to the bit line BL.

For example, when the signal value of the source line SL is "0" and the signal value of the bit line BL is "1", the reading determining section 113B determines that the "0 write" operation is specified, and outputs, to the output switch 113A, the control signal Trg2 for turning off the output switch 113A. At this time, the output switch 113A is turned off, which causes the output end of the register section 112A (the output end of the resistance-change memory element 110) to be opened to the bit line BL.

For example, when the signal value of the source line SL is "0" and the signal value of the bit line BL is "Hi-z", the reading determining section 113B determines that the "read" operation is specified, and outputs, to the output switch 113A, the control signal Trg2 for turning on the output switch 113A. At this time, the output switch 113A is turned on, which couples the output end of the register section 112A (the output end of the resistance-change memory element 110) to the bit line BL. As a result, the register value ("1" or "0") held in the register section 112A is read to the bit line BL.

Thus, in the present modification example, a wiring line for reading is different from that in the embodiment described above, but writing control and reading control similar to those in the embodiment described above are performed. Accordingly, in the present modification example, effects similar to those in the embodiment described above are achieved.

3. Second Embodiment

Configuration

FIG. 9 illustrates an example of functional blocks of an operation model 200 according to a second embodiment of the present disclosure. The operation model 200 corresponds to a specific example of a portion of a "logic simulation device" or a specific example of a portion of a "logic simulation program" in the present disclosure. The operation model 200 is provided between two terminals (the bit line BL and the source line SL) as in the embodiment described above. The operation model 200 is a model in which a resistance-change memory element is represented by a logic element. For example, as illustrated in FIG. 9, the operation model 200 is coupled to a control terminal (a word line WL) different from the two terminals (the bit line BL and the source line SL), and controls a selection state in which data writing or data reading is performed and a non-selection state of the resistance-change memory element by a signal value of the word line WL. For example, when the signal value of the word line WL is "1", one operation of data writing and data reading is performed, and when the signal value of the word line WL is "0", the resistance-change memory element is turned to non-selection, and neither data writing nor data reading is performed.

The operation model 200 includes, for example, a resistance-change memory element 210 and a truth table 220 as illustrated in FIG. 9. In a case where the operation model 200 corresponds to a specific example of a portion of a "logic simulation device" in the present disclosure, the resistance-change memory element 210 is configured by hardware that implements a function of the resistance-change memory element 210, and the truth table 220 is stored in, for example, a volatile memory such as a DRAM or a non-volatile memory such as an EEPROM or a flash memory. In a case where the operation model 200 corresponds to a specific example of a portion of a "logic simulation program" in the present disclosure, the operation model 200 is stored in, for example, a volatile memory such as a DRAM or a non-volatile memory such as an EEPROM or a flash memory, and the operation model 200 is loaded on a CPU, thereby causing the CPU to implement the function of the operation model 200.

The resistance-change memory element 210 is provided between the bit line BL and the source line SL. The resistance-change memory element 210 includes, for example, a writing operation section 211, a data holding section 212, and a reading operation section 213.

The writing operation section 211 controls data writing to the data holding section 212. The writing operation section 211 includes, for example, a writing determining section 211A as illustrated in FIG. 9. The bit line BL, the source line SL, and the word line WL are coupled to the writing determining section 211A. The writing determining section 211A performs determination about data writing to the data holding section 212 (a register section 212A to be described later) on the basis of the signal values inputted to the bit line BL, the source line SL, and the word line WL, and the truth table 220. When the writing determining section 211A determines that data writing to the data holding section 212 (the register section 212A) is specified, on the basis of data inputted to the bit line BL, the source line SL, and the word line WL, and the truth table 220, the writing determining section 211A outputs, to the data holding section 212 (the register section 212A), the control signal Trg1 for writing the signal value inputted to the source line SL to the data holding section 212 (the register section 212A).

FIG. 10 illustrates a specific example of the truth table 220. The truth table 220 includes data defining a relationship between signal values of the bit line BL, the source line SL, and the word line WL, and data writing to the register section 212A and data reading from the register section 212A. The truth table 220 defines, for example, four types of operation modes including the "1 write" operation, the "0 write" operation, the "read" operation, and a "non-selection" operation, as illustrated in FIG. 10.

In the "1 write" operation, it is defined that when the signal value of the source line SL is "1", the signal value of the bit line BL is "0", and the signal value of the word line WL is "1", "1" is written as a register value to the register section 212A. When the "1 write" operation is executed, "Hi-z" is outputted from the resistance-change memory element 210 to the source line SL.

In the "0 write" operation, it is defined that when the signal value of the source line SL is "0", the signal value of the bit line BL is "1", and the signal value of the word line WL is "1", "0" is written as a register value to the register section 212A. When the "0 write" operation is executed, "Hi-z" is outputted from the resistance-change memory element 210 to the source line SL.

In the "read" operation, it is defined that when the signal value of the source line SL is "Hi-z", the signal value of the bit line BL is "0", and the signal value of the word line WL is "1", "1" or "0" is read as a register value from the register section 212A. When the "read" operation is executed, the register value ("1" or "0") is read from the resistance-change memory element 210 to the source line SL.

In the "non-selection" operation, when the signal value of the word line WL is "0", neither data writing nor data reading is performed, and the source line SL becomes "Hi-z".

The writing determining section 211A determines to which one of the plurality of operation modes defined by the truth table 220 the data (the signal values) inputted to the bit line BL, the source line SL, and the word line WL corresponds. The writing determining section 211A performs control corresponding to the corresponding operation mode on the data holding section 212 (the register section 212A). For example, when the signal value of the source line SL is "1", the signal value of the bit line BL is "0", and the signal value of the word line WL is "1", the writing determining section 211A determines that the "1 write" operation is specified, and outputs, to the register section 212A, the control signal Trg1 for writing the data (the signal value) (="1") inputted to the source line SL as a register value to the register section 212A. For example, when the signal value of the source line SL is "0", the signal value of the bit line BL is "1", and the signal value of the word line WL is "1", the writing determining section 211A determines that the "0 write" operation is specified and outputs, to the register section 212A, the control signal Trg1 for writing the data (the signal value) (="0") inputted to the source line SL as a register value to the register section 212A.

For example, when the signal value of the source line SL is "Hi-z", the signal value of the bit line BL is "0", and the signal value of the word line WL is "1", the writing determining section 211A determines that the "read" operation is specified, and does not output the control signal Trg1 but outputs a constant voltage lower than a threshold value to the register section 212A. The threshold value is used for detection of the control signal Trg1 in the register section 212A. For example, when the signal value of the word line WL is "0", the writing determining section 211A determines that the "non-selection" operation is specified, and does not output the control signal Trg1 but outputs a constant voltage lower than a threshold value to the register section 212A. The threshold value is used for detection of the control signal Trg1 in the register section 212A.

The data holding section 212 holds the signal value of the source line SL in accordance with control by the writing determining section 211A. The data holding section 212 includes, for example, the register section 212A as illustrated in FIG. 9. The source line SL is coupled to the register section 212A. The register section 212A uses, as a trigger, the control signal Trg1 inputted from the writing determining section 211A to receive the signal value of the source line SL and store the signal value as a register value. The register section 212A outputs "Hi-z" to the reading operation section 213 upon the "1 write" operation or the "0 write" operation. The register section 212A outputs the register value to the reading operation section 213 upon the "read" operation. The register section 212A outputs "Hi-z" to the reading operation section 213 upon the "non-selection" operation.

The reading operation section 213 includes, for example, an output switch 213A and a reading determining section 213B as illustrated in FIG. 9. The output switch 213A is coupled to an output end of the register section 212A and the source line SL, and performs connection and disconnection between the output end of the register section 212A and the source line SL in accordance with the control signal Trg2 from the reading determining section 213B.

The reading determining section 213B controls data reading to the source line SL. The bit line BL, the source line SL, and the word line WL are coupled to the reading determining section 213B. The reading determining section 213B performs determination about data reading from the register section 212A to the source line SL on the basis of the signal values inputted to the bit line BL, the source line SL, and the word line WL and the truth table 220. When the reading determining section 213B determines that data reading is specified, on the basis of data inputted to the bit line BL, the source line SL, and the word line WL and the truth table 220, the reading determining section 213B outputs, to the output switch 213A, the control signal Trg2 for reading the register value from the register section 212A to the source line SL. In a case where the control signal Trg2 for reading the register value is inputted from the reading determining section 213B to the output switch 213A, the output switch 213A couples the output end of the register section 212A and the source line SL to each other.

The reading determining section 213B determines to which one of the plurality of operation modes defined by the truth table 220 the data (the signal values) inputted to the bit line BL, the source line SL, and the word line WL corresponds. As a result, the reading determining section 213B performs control corresponding to the corresponding operation mode on the output switch 213A.

For example, when the signal value of the source line SL is "1", the signal value of the bit line BL is "0", and the signal value of the word line WL is "1", the reading determining section 213B determines that the "1 write" operation is specified, and outputs, to the output switch 213A, the control signal Trg2 for turning off the output switch 213A. At this time, the output switch 213A is turned off, which causes the output end of the register section 212A (an output end of the resistance-change memory element 210) to be opened to the source line SL.

For example, when the signal value of the source line SL is "0", the signal value of the bit line BL is "1", and the signal value of the word line WL is "1", the reading determining section 213B determines that the "0 write" operation is specified, and outputs, to the output switch 213A, the control signal Trg2 for turning off the output switch 213A. At this time, the output switch 213A is turned off, which causes the output end of the register section 212A (the output end of the resistance-change memory element 210) to be opened to the source line SL.

For example, when the signal value of the source line SL is "Hi-z", the signal value of the bit line BL is "0", and the signal value of the word line WL is "1", the reading determining section 213B determines that the "read" operation is specified, and outputs, to the output switch 213A, the control signal Trg2 for turning on the output switch 213A. At this time, the output switch 213A is turned on, which couples the output end of the register section 212A (the output end of the resistance-change memory element 210) to the source line SL. As a result, the register value ("1" or "0") held in the register section 212A is read to the source line SL.

For example, when the signal value of the word line WL is "0", the reading determining section 213B determines that the "non-selection" operation is specified, and outputs, to the output switch 213A, the control signal Trg2 for turning off the output switch 213A. At this time, the output switch 213A is turned off, which causes the output end of the register section 212A (the output end of the resistance-change memory element 210) to be opened to the source line SL.

FIG. 11 illustrates an example of an operation in the operation model 200. The operation model 200 determines whether or not the signal value of the word line WL is "1" (step S201). As a result, when the signal value of the word line WL is not "1", the operation model 200 opens the output switch 113A (step S202). As a result, the signal value of the source line SL becomes Hi-z (step S203), and the operation ends.

Meanwhile, when the signal value of the word line WL is "1", the operation model 200 determines whether or not an exclusive-OR of the signal value of the source line SL and the signal value of the bit line BL is "1" (step S204). As a result, when the exclusive-OR described above is not "1", the operation model 200 closes the output switch 113A (step S205). Subsequently, the operation model 200 determines whether or not the signal value of the source line SL is "Hi-z" and the signal value of the bit line BL is "0" (step S206). As a result, when the signal value of the source line SL is not "Hi-z" or the signal value of the bit line BL is not "0", the operation model 200 ends the operation. Meanwhile, when the signal value of the source line SL is "Hi-z" and the signal value of the bit line BL is "0", the operation model 200 reads the value (the register value) of the register section 112A to the source line SL (step S207), and ends the operation.

In the step S04 described above, when the exclusive-OR described above is "1", the operation model 200 opens the output switch 113A (step S208). Subsequently, the operation model 200 writes the signal value of the source line SL as the register value to the register section 112A (step S209), and ends the operation.

Effects

Next, description is given of effects of the operation model 200.

In the present embodiment, determination about data writing, data reading, and non-selection is performed on the basis of the signal values inputted to the bit line BL, the source line SL, and the word line WL, and the truth table 220. Thus, for example, even in a case where signals are applied to both ends of the resistance-change memory element 210, signal collision such as a resistance logic element does not occur. It is therefore possible to reproduce data writing to the resistance-change memory element, data reading from the resistance-change memory element, and non-selection of the resistance-change memory element in a logic simulation.

In addition, in the present embodiment, when it is determined that data writing is specified, on the basis of the signal values inputted to the bit line BL, the source line SL, and the word line WL and the truth table 220, the signal value inputted to the source line SL is written as a register value to the register section 212A. Thus, for example, even in a case where signals are applied to both ends of the resistance-change memory element 210, signal collision such as a resistance logic element does not occur. It is therefore possible to reproduce data writing to the resistance-change memory element in a logic simulation.

In addition, in the present embodiment, when it is determined that data reading is specified, on the basis of the signal values inputted to the bit line BL, the source line SL, and the word line WL, and the truth table 220, the register value held in the register section 212A is outputted to the source line SL. Thus, for example, even in a case where signals are applied to both ends of the resistance-change memory element 210, signal collision such as a resistance logic element does not occur. It is therefore possible to reproduce data reading from the resistance-change memory element in a logic simulation.

4. Modification Examples of Second Embodiment

Modification Example C

FIG. 12 illustrates a modification example of the operation in the operation model 200 according to the second embodiment described above. The operation model 200 determines whether or not the signal value of the word line WL is "1" (step S301). As a result, when the signal value of the word line WL is not "1", the operation model 200 opens the output switch 213A (step S302). As a result, the signal value of the source line SL becomes "Hi-z" (step S303), and the operation ends.

Meanwhile, when the signal value of the word line WL is "1", the operation model 200 (the reading determining section 213B) waits for a lapse of a predetermined time (Read Wait time) from when the signal value of the word line WL becomes "1" (step S304). After the lapse of the Read Wait time, the operation model 200 determines whether or not the signal value of the source line SL is "Hi-z" and the signal value of the bit line BL is "0" (step S305). As a result, when the signal value of the source line SL is not "Hi-z" or the signal value of the bit line BL is not "0", the operation model 200 ends the operation. Meanwhile, when the signal value of the source line SL is "Hi-z" and the signal value of the bit line BL is "0", the operation model 200 closes the output switch 213A (step S306). Subsequently, the operation model 200 reads the value (the register value) of the register section 212A to the source line SL (step S307), and ends the operation.

When the signal value of the word line WL is "1", the operation model 200 determines whether or not the exclusive-OR of the signal value of the source line SL and the signal value of the bit line BL is "1" (step S308). As a result, when the exclusive-OR described above is not "1", the operation model 200 ends the operation. Meanwhile, when the exclusive-OR described above is "1", the operation model 200 (the writing determining section 211A) waits for a lapse of a predetermined time (Write Wait time) from when it is determined that the exclusive-OR described above is "1" (step S309). After the lapse of the Write Wait time, the operation model 200 determines whether or not the signal value of the source line SL is "Hi-z" and the signal value of the bit line BL "0" (step S310). As a result, when the signal value of the source line SL is not "Hi-z" or the signal value of the bit line BL is not "0", the operation model 200 ends the operation. Meanwhile, when the signal value of the source line SL is "Hi-z" and the signal value of the bit line BL is "0", the operation model 200 opens the output switch 213A (step S311). Subsequently, the operation model 200 writes the signal value of the source line SL as the register value to the register section 212A (step S312), and ends the operation.

Thus, in the present modification example, a timing of outputting the register value held in the register section 212A to the source line SL is controlled on the basis of the signal value of the word line WL. This makes it possible to reproduce access time to the register section 212A upon reading. In addition, in the present modification example, a timing of writing to the register section 212A is controlled on the basis of the signal values of the source line SL and the bit line BL. This causes write data to be written to the register section 212A after a writing state continues for a certain time. As a result, it is possible to avoid a malfunction in which the writing operation occurs due to an accumulation of short pulses.

Modification Example D

FIG. 13 illustrates a modification example of the operation in the operation model 200 according to the second embodiment described above. The operation model 200 determines whether or not the signal value of the word line WL is "1" (step S401). As a result, when the signal value of the word line WL is not "1", the operation model 200 opens the output switch 213A (step S402). As a result, the signal value of the source line SL becomes "Hi-z" (step S403), and the operation ends.

Meanwhile, when the signal value of the word line WL is "1", the operation model 200 closes the output switch 213A (step S404). Subsequently, the operation model 200 reads the value (the register value) of the register section 212A in Weak to the source line SL (step S405). Thereafter, the operation model 200 determines whether or not the exclusive-OR of the signal value of the source line SL and the signal value of the bit line BL is "1" (step S406). As a result, when the exclusive-OR described above is not "1", the operation model 200 ends the operation. Meanwhile, when the exclusive-OR described above is "1", the operation model 200 writes the signal value of the source line SL as the register value to the register section 212A (step S407), and ends the operation.

Thus, in the present modification example, the register value held in the register section 212A is outputted in weak to the source line SL. It is therefore possible to reproduce data reading in weak from the resistance-change memory element in a logic simulation.

Modification Example E

FIGS. 14, 15, and 16 each illustrate a modification example of functional blocks of the operation model 200 according to the second embodiment described above. In the present modification example, the operation model 200 includes a plurality of resistance-conversion memory elements 210.

FIG. 14 exemplifies a case where the operation model 200 includes two resistance-conversion memory elements 210. In the operation model 200 in FIG. 14, a pair of wiring lines (the source line SL and the bit line BL) and the truth table 220 are assigned to each resistance-conversion memory element 210, and a common word line WL is assigned to the plurality of resistance-conversion memory elements 210.

FIG. 15 exemplifies a case where the operation model 200 includes two resistance-conversion memory elements 210. In the operation model 200 in FIG. 15, a common pair of wiring lines (the source line SL and the bit line BL) is assigned to the plurality of resistance-conversion memory elements 210. Further, the word line WL and the truth table 220 are assigned to each resistance-conversion memory element 210.

FIG. 16 exemplifies a case where the operation model 200 includes a plurality of resistance-conversion memory elements 210 arranged in a matrix (m×n). In the operation model 200 in FIG. 16, a pair of wiring lines (the source line SL and the bit line BL) and the truth table 220 are assigned to each of a plurality of resistance-conversion memory elements 210 arranged in a row direction, and a common word line WL is assigned to the plurality of resistance-conversion memory elements 210 arranged in the row direction. In the operation model 200 in FIG. 16, a common pair of wiring lines (the source line SL and the bit line BL) is further assigned to a plurality of resistance-conversion memory elements 210 arranged in a column direction, and the word line WL is assigned to each of the plurality of resistance-conversion memory elements 210 arranged in the column direction.

Thus, in the present modification example, the plurality of resistance-conversion memory elements 210 is provided in the operation model 200. This makes it possible to reproduce a memory cell array by the operation model 200.

Modification Example F

In the second embodiment described above and the modification examples thereof, the source line SL and the bit line BL may be reversed. For example, as illustrated in FIG. 17, in the second embodiment described above, the source line SL and the bit line BL may be reversed. In this case, a truth table 221 is provided in place of the truth table 220.

FIG. 18 illustrates a specific example of the truth table 221. The truth table 221 includes data defining a relationship between the signal values of the bit line BL, the source line SL, and the word line WL, and data writing to the register section 212A and data reading from the register section 212A. The truth table 221 defines, for example, four types of operation modes including the "1 write" operation, the "0 write" operation, the "read" operation, and the "non-selection" operation as illustrated in FIG. 18.

In the "1 write" operation, it is defined that when the signal value of the source line SL is "1", the signal value of the bit line BL is "0", and the signal value of the word line WL is "1", "1" is written as a register value to the register section 212A. When the "1 write" operation is executed, "Hi-z" is outputted from the resistance-change memory element 210 to the bit line BL.

In the "0 write" operation, it is defined that when the signal value of the source line SL is "0", the signal value of the bit line BL is "1", and the signal value of the word line WL is "1", "0" is written as a register value to the register section 212A. When the "0 write" operation is executed, "Hi-z" is outputted from the resistance-change memory element 210 to the bit line BL.

In the "read" operation, it is defined that when the signal value of the bit line BL is "Hi-z", the signal value of the source line SL is "0", and the signal value of the word line WL is "1", "1" or "0" is read as a register value from the register section 212A. When the "read" operation is executed, the register value ("1" or "0") is read from the resistance-change memory element 210 to the bit line BL.

In the "non-selection" operation, it is defined that when the signal value of the word line WL is "0", the register value is read from the register section 212A. Note that when the "read" operation is executed, "Hi-z" is outputted from the resistance-change memory element 210 to the bit line BL.

In the present modification example, the writing determining section 211A determines to which one of the plurality of operation modes defined by the truth table 220 the data (the signal values) inputted to the bit line BL, the source line SL, and the word line WL corresponds. The writing determining section 211A performs control corresponding to the corresponding operation mode on the data holding section 212 (the register section 212A). For example, when the signal value of the source line SL is "1", the signal value of the bit line BL is "0", and the signal value of the word line WL is "1", the writing determining section 211A determines that the "1 write" operation is specified, and outputs, to the register section 212A, the control signal Trg1 for writing the data (the signal value) (="1") inputted to the source line SL as a register value to the register section 212A. For example, when the signal value of the source line SL is "0", the signal value of the bit line BL is "1", and the signal value of the word line WL is "1", the writing determining section 211A determines that the "0 write" operation is specified and outputs, to the register section 212A, the control signal Trg1 for writing the data (the signal value) (="0") inputted to the source line SL as a register value to the register section 212A.

For example, when the signal value of the bit line BL is "Hi-z", the signal value of the source line SL is "0", and the signal value of the word line WL is "1", the writing determining section 211A determines that the "read" operation is specified, and does not output the control signal Trg1 but outputs a constant voltage lower than a threshold value to the register section 212A. The threshold value is used for detection of the control signal Trg1 in the register section 212A. For example, when the signal value of the word line WL is "0", the writing determining section 211A determines that the "non-selection" operation is specified, and does not output the control signal Trg1 but outputs a constant voltage lower than a threshold value to the register section 212A. The threshold value is used for detection of the control signal Trg1 in the register section 212A.

In the present modification example, for example, as illustrated in FIG. 17, the output switch 213A is coupled to the output end of the register section 212A and the bit line BL, and performs connection and disconnection between the output end of the register section 212A and the bit line BL in accordance with the control signal Trg2 from the reading determining section 213B.

In the present modification example, the reading determining section 213B controls data reading to the bit line BL. The bit line BL, the source line SL, and the word line WL are coupled to the reading determining section 213B. The reading determining section 213B performs determination about data reading from the register section 212A to the bit line BL on the basis of the signal values inputted to the bit line BL, the source line SL, and the word line WL and the truth table 221. When the reading determining section 213B determines that data reading is specified on the basis of data inputted to the bit line BL, the source line SL, and the word line WL and the truth table 221, the reading determining section 213B outputs, to the output switch 213A, the control signal Trg2 for reading the register value from the register section 212A to the bit line BL. In a case where the control signal Trg2 for reading the register value is inputted from the reading determining section 213B to the output switch 213A, the output switch 213A couples the output end of the register section 212A and the bit line BL to each other.

The reading determining section 213B determines to which one of the plurality of operation modes defined by the truth table 221 the data (the signal values) inputted to the bit line BL, the source line SL, and the word line WL corresponds. As a result, the reading determining section 213B performs control corresponding to the corresponding operation mode on the output switch 213A.

For example, when the signal value of the source line SL is "1", the signal value of the bit line BL is "0", and the signal value of the word line WL is "1", the reading determining section 213B determines that the "1 write" operation is specified, and outputs, to the output switch 213A, the control signal Trg2 for turning off the output switch 213A. At this time, the output switch 213A is turned off, which causes the output end of the register section 212A (the output end of the resistance-change memory element 210) to be opened to the bit line BL.

For example, when the signal value of the source line SL is "0", the signal value of the bit line BL is "1", and the signal value of the word line WL is "1", the reading determining section 213B determines that the "0 write" operation is specified, and outputs, to the output switch 213A, the control signal Trg2 for turning off the output switch 213A. At this time, the output switch 213A is turned off, which causes the output end of the register section 212A (the output end of the resistance-change memory element 210) to be opened to the bit line BL.

For example, when the signal value of the source line SL is "0", the signal value of the bit line BL is "Hi-z", and the signal value of the word line WL is "1", the reading determining section 213B determines that the "read" operation is specified, and outputs, to the output switch 213A, the control signal Trg2 for turning on the output switch 213A. At this time, the output switch 213A is turned on, which couples the output end of the register section 212A (the output end of the resistance-change memory element 210) to the bit line BL. As a result, the register value ("1" or "0") held in the register section 212A is read to the bit line BL.

For example, when the signal value of the word line WL is "0", the reading determining section 213B determines that the "non-selection" operation is specified, and outputs, to the output switch 213A, the control signal Trg2 for turning off the output switch 213A. At this time, the output switch 213A is turned off, which causes the output end of the register section 212A (the output end of the resistance-change memory element 210) to be opened to the bit line BL.

Thus, in the present modification example, a wiring line for reading is different from that in the second embodiment described above, but writing control and reading control similar to those in the second embodiment described above are performed. Accordingly, in the present modification example, effects similar to those in the embodiment described above are achieved.

5. Application Example

FIG. 19 illustrates an example of functional blocks of an information processing system to which any of the operation models 100 and 200 according to the embodiments described above and the modification examples thereof is applied. The information processing system includes a host computer 300 and a memory unit 400. The memory unit 400 includes a memory controller 500, one or more memory cell array units 600, and a power supply unit 700. It is to be noted that FIG. 19 illustrates an example of a state in which one memory cell array unit 600 is provided. The memory unit 400 corresponds to a specific example of a "logic simulation device" or a "logic simulation program" in the present disclosure.

(Host Computer 300)

The host computer 300 controls the memory unit 400. Specifically, the host computer 300 issues a command that specifies a logic address of an access destination and supplies the command and data to the memory unit 400. The host computer 300 receives the data outputted from the memory unit 400. Here, the command is for controlling the memory unit 400, and includes, for example, a write command that instructs a writing process of the data and a read command that instructs a reading process of the data. In addition, the logic address is an address allocated for each region of an access unit when the host computer 300 accesses the memory unit 400 in an address space defined by the host computer 300.

(Memory Controller 500)

The memory controller 500 controls one or more memory cell array units 600. The memory controller 500 receives, from the host computer 300, the write command that specifies the logic address. Further, the memory controller 500 executes a writing process of data in accordance with the write command. In the writing process, the logic address is converted into a physical address and the data is written to the physical address. Here, the physical address is an address allocated in one or more memory cell array units 600 for each access unit when the memory controller 500 accesses one or more memory cell array units 600. When the memory controller 500 receives the read command that specifies the logic address, the memory controller 500 converts the logic address into the physical address and reads data from the physical address. The memory controller 500 then outputs, to the host computer 300, the thus-read data as read data.

(Power Supply Unit 700)

The power supply unit 700 supplies a desired voltage to one or more memory cell array units 600. The power supply unit 700 supplies, to a row driver 22 to be described later, for example, a voltage used at the time of writing or at the time of reading, or the like. The power supply unit 700 supplies, to a column driver 23 to be described later, a voltage used at the time of writing or at the time of reading, or the like.

(Memory Cell Array Unit 600)

Next, description is given of the memory cell array unit 600. FIG. 20 illustrates an example of functional blocks of the memory cell array unit 600. The memory cell array unit 600 is configured by, for example, a semiconductor chip. The memory cell array unit 600 includes, for example, a memory cell array 60 and a driving unit 70. The driving unit 70 exchanges the command, the write data, the read data, etc., with, for example, the memory controller 500. For example, the driving unit 70 writes the data to the memory cell array 60 in accordance with the write command, and reads the data from the memory cell array 60 in accordance with the read command.

(Memory Cell Array 60)

The memory cell array 60 includes a plurality of memory cells MC. The memory cells MC each include, for example, the operation model 200 according to the second embodiment described above.

The memory cell array 60 includes a plurality of word lines WL, a plurality of bit lines BL, a plurality of memory cells MC, and a plurality of source lines SL. The plurality of memory cells MC is disposed one by one at each position where the word line WL and the bit line BL are opposed to each other. In the memory cell array 60, it is possible to write data to the memory cell MC specified by an external address input. In addition, it is possible to read data stored in the memory cell MC specified by an address input.

(Driving Unit 70)

Next, description is given of the driving unit 70. The driving unit 70 includes, for example, an address controller 71, the word line selector 72, the command controller 73, a writing controller 74, a source line-bit line selector 75, and a reading controller 76, as illustrated in FIG. 20.

The address controller 71 outputs, to the word line selector 72, a control signal corresponding to a row address inputted from an address line and outputs, to the source line-bit line selector 75, a control signal corresponding to a column address inputted from the address line. The address controller 71 outputs, to the word line selector 72 and the source line-bit line selector 75, a signal that controls a timing of changing an output voltage. The word line selector 72 includes a circuit that drives each word line WL with a predetermined voltage necessary for an operation of writing or reading when performing the operation of writing or reading. The word line selector 72 is coupled to each word line WL of the memory cell array 60, and selects a word line WL corresponding to a row address inputted from an address line. The word line selector 72 outputs a predetermined voltage necessary for the operation of writing or reading to the selected word line WL.

The source line-bit line selector 75 includes a circuit that drives the bit line BL and the source line SL coupled to the memory cell MC to which data is to be written with a predetermined voltage necessary for the writing operation, when performing the writing operation. The source line-bit line selector 75 further includes a circuit that drives the bit line BL and the source line SL coupled to the memory cell MC from which data is to be read with a predetermined voltage that does not cause rewriting of the data, when performing the reading operation of the data.

The source line-bit line selector 75 is coupled to each bit line BL and each source line SL of the memory cell array 60, and selects a corresponding bit line BL and a corresponding source line SL in accordance with a column address inputted from an address line. The source line-bit line selector 75 outputs, to the selected bit line BL and the selected source line SL, a predetermined voltage necessary for the operation of writing or reading.

The command controller 73 controls the word line selector 72, the writing controller 74, and the reading controller 76 in accordance with a command inputted from the memory controller 500. The command controller 73 instructs the writing controller 74 to output input data Din inputted from the memory controller 500 to the source line-bit line selector 75 at a predetermined timing, and instructs the word line selector 72 to scan the memory cell array 60 at a predetermined timing. The writing controller 74 outputs the input data Din to the source line-bit line selector 75 at a predetermined timing. The command controller 73 further instructs the reading controller 76 to read data from the memory cell array 60. The reading controller 76 outputs the data read from the memory cell array 60 as output data Dout to the memory controller 500.

In the present application example, any of the operation models 100 and 200 according to the embodiments described above and the modification examples thereof is applied to the information processing system. This makes it possible to reproduce data writing to the resistance-change memory element and data reading from the resistance-change memory element in a logic simulation.

According to a logic simulation device and a logic simulation program according to an aspect of the present disclosure, determination about data writing and data reading is performed on the basis of signal values inputted to two terminals and a truth table; therefore, for example, even in a case where signals are applied to both ends of the resistance-change memory element, signal collision such as a resistance logic element does not occur. It is therefore possible to reproduce data writing to the resistance-change memory element and data reading from the resistance-change memory element.

It is to be noted that the effects described herein are merely illustrative. The effects of the present disclosure are not limited to those described herein. The present disclosure may have effects other than those described herein.

In addition, for example, the present disclosure may also have the following configurations.

(1)

A logic simulation device including:
an operation model of a resistance-change memory element, the resistance-change memory element provided between two terminals,
the operation model including
a register section for holding data,
a truth table defining a relationship between signal values of the two terminals, and data writing to the register section and data reading from the register section, and
a determining section that performs determination about the data writing and the data reading on the basis of signal values inputted to the two terminals and the truth table.

(2)

The logic simulation device according to (1), in which when the determining section determines that the data writing is specified, on the basis of the signal values inputted to the two terminals and the truth table, the determining section writes, to the register section, the signal value inputted one of the two terminals as a register value.

(3)

The logic simulation device according to (2), in which the determining section controls a timing of storing the signal value as the register value in the register section on the basis of an inputted control signal.

(4)

The logic simulation device according to any one of (1) to (3), in which when the determining section determines that the data reading is specified, on the basis of signal values inputted to the two terminals and the truth table, the determining section outputs a register value held in the register to one of the two terminals.

(5)

The logic simulation device according to (4), in which the determining section controls a timing of outputting the register value held in the register to one of the two terminals on the basis of an inputted control signal.

(6)

The logic simulation device according to (4), in which the determining section always outputs the register value held in the register in weak to one of the two terminals.

(7)

A logic simulation program including a logic simulation program of a resistance-change memory element, the resistance-change memory element provided between two terminals, the logic simulation program that causes a computer to execute:

performing determination about data writing to a register section for holding data and data reading from the register section on the basis of a truth table and signal values inputted to the two terminals, the truth table defining a relationship between signal values of the two terminals, and the data writing and the data reading.

This application claims the priority on the basis of Japanese Patent Application No. 2020-146418 filed on Aug. 31, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A logic simulation device, comprising:
an operation model of a resistance-change memory element, wherein
the operation model of the resistance-change memory element is between two terminals,
the operation model including:
a register section configured to hold data,
a truth table that defines a relationship between first signal values of the two terminals, and a data writing operation to the register section and a data reading operation from the register section, and
a determining section configured to determine the data writing operation and the data reading operation, based on second signal values inputted to the two terminals and the truth table.

2. The logic simulation device according to claim 1, wherein when the determining section determines that the data writing operation is specified, based on the second signal values inputted to the two terminals and the truth table, the determining section is further configured to:
write, to the register section, a signal value, of the second signal values, inputted one of the two terminals as a register value.

3. The logic simulation device according to claim 2, wherein the determining section is further configured to control a timing of storing the signal value as the register value in the register section based on an inputted control signal.

4. The logic simulation device according to claim 1, wherein when the determining section determines that the data reading operation is specified, based on the second signal values inputted to the two terminals and the truth table, the determining section is further configured to:
output a register value held in the register section to one of the two terminals.

5. The logic simulation device according to claim 4, wherein the determining section is further configured to control a timing of outputting the register value held in the register section to one of the two terminals based on an inputted control signal.

6. The logic simulation device according to claim 4, wherein the determining section is further configured to output the register value held in the register section in weak to one of the two terminals.

7. A non-transitory computer-readable medium having stored thereon computer-executable instructions of an operation model of a resistance-change memory element which, when executed by a computer, cause the computer to execute operations, the operations comprising
determining data writing to a register section for holding data and data reading from the register section, based on a truth table and first signal values inputted to two terminals, wherein
the operation model of the resistance-change memory element is between the two terminals, and
the truth table defines a relationship between second signal values of the two terminals, and the data writing and the data reading.

* * * * *